United States Patent
Lee

(10) Patent No.: US 9,755,176 B2
(45) Date of Patent: Sep. 5, 2017

(54) ORGANIC LIGHT-EMITTING DEVICE

(71) Applicant: Samsung Display Co. Ltd., Yongin, Gyeonggi-Do (KR)

(72) Inventor: Min Woo Lee, Suwon-si (KR)

(73) Assignee: Samsung Display Co., Ltd., Yongin (KR)

( * ) Notice: Subject to any disclaimer, the term of this patent is extended or adjusted under 35 U.S.C. 154(b) by 20 days.

(21) Appl. No.: 14/574,133

(22) Filed: Dec. 17, 2014

(65) Prior Publication Data

US 2016/0005991 A1 Jan. 7, 2016

(30) Foreign Application Priority Data

Jul. 2, 2014 (KR) .................. 10-2014-0082488

(51) Int. Cl.
- *H01L 29/08* (2006.01)
- *H01L 51/50* (2006.01)
- *H01L 51/00* (2006.01)

(52) U.S. Cl.
CPC ...... *H01L 51/5044* (2013.01); *H01L 51/0046* (2013.01); *H01L 51/0081* (2013.01); *H01L 51/0085* (2013.01)

(58) Field of Classification Search
CPC .................. H01L 51/0046; H01L 51/5044
USPC ....... 257/40, 88, 79; 428/212; 136/263, 255; 544/251
See application file for complete search history.

(56) References Cited

U.S. PATENT DOCUMENTS

| | | | | |
|---|---|---|---|---|
| 7,521,113 | B2 * | 4/2009 | Lu | ............... B82Y 10/00 257/79 |
| 8,981,355 | B2 * | 3/2015 | Seo | ............... H01L 51/5016 257/40 |
| 2006/0011927 | A1 | 1/2006 | Ko | |
| 2006/0014044 | A1 | 1/2006 | Ko | |
| 2006/0157728 | A1 * | 7/2006 | Iou | ............... B82Y 10/00 257/103 |
| 2007/0235742 | A1 * | 10/2007 | Tobise | ............... H01L 51/5012 257/79 |
| 2010/0089443 | A1 * | 4/2010 | Bloomstein | ............... H01L 51/0096 136/255 |
| 2012/0074392 | A1 * | 3/2012 | Huang | ............... H01L 27/3209 257/40 |

(Continued)

FOREIGN PATENT DOCUMENTS

| | | |
|---|---|---|
| JP | 2007-242733 A | 9/2007 |
| KR | 2006-0108332 A | 10/2006 |

(Continued)

*Primary Examiner* — Mohammed Shamsuzzaman

(74) *Attorney, Agent, or Firm* — Knobbe Martens Olson & Bear LLP

(57) ABSTRACT

An organic light-emitting device comprises a first electrode, a second electrode disposed on the first electrode, a first organic light-emitting layer disposed between the first electrode and the second electrode, a second organic light-emitting layer disposed between the first organic light-emitting layer and the second electrode, a first charge generation layer (CGL) disposed between the first organic light-emitting layer and the second organic light-emitting layer, a second CGL disposed between the first CGL and the second organic light-emitting layer, and a first buffer layer disposed between the first CGL and the second CGL and including fullerene.

18 Claims, 4 Drawing Sheets

(56) References Cited

U.S. PATENT DOCUMENTS

| | | | |
|---|---|---|---|
| 2012/0090685 A1* | 4/2012 | Forrest | B82Y 10/00 |
| | | | 136/263 |
| 2012/0097989 A1* | 4/2012 | Lee | H01L 51/5278 |
| | | | 257/88 |
| 2012/0241726 A1* | 9/2012 | Kijima | H01L 51/5278 |
| | | | 257/40 |
| 2012/0283437 A1* | 11/2012 | Lux | H01L 51/0072 |
| | | | 544/251 |
| 2014/0332790 A1* | 11/2014 | Fadhel | H01L 51/0072 |
| | | | 257/40 |
| 2015/0053939 A1* | 2/2015 | Adamovich | H01L 51/0054 |
| | | | 257/40 |

FOREIGN PATENT DOCUMENTS

| | | |
|---|---|---|
| KR | 2012-0042038 A | 5/2012 |
| KR | 2013-0006937 A | 1/2013 |
| KR | 10-1347656 B1 | 1/2014 |

* cited by examiner

ORGANIC LIGHT-EMITTING DEVICE

This application claims priority to Korean Patent Application No. 10-2014-0082488 filed on Jul. 2, 2014 in the Korean Intellectual Property Office, the disclosure of which is incorporated herein by reference in its entirety.

BACKGROUND

1. Field

The present disclosure relates to an organic light-emitting device.

2. Description of the Related Art

An organic light-emitting display device may include an array of organic light-emitting devices or pixels. The organic light-emitting device may include an anode, a cathode, and at least one organic light-emitting layer disposed between the anode and the cathode. The organic light-emitting device may generate excitons by injecting holes provided by the anode and electrons provided by the cathode into the organic light-emitting layer so as for the holes and the electrons to be combined, and may generate light in response to the excitons returning to a ground state. In addition to the organic light-emitting layer between the anode and the cathode, the organic light-emitting device may also include a hole injection layer, a hole transport layer, an electron injection layer and an electron transport layer.

SUMMARY

Embodiments of the invention provide an organic light-emitting device with a tandem structure, which can lower a driving voltage while not causing any deterioration in the efficiency and lifetime properties thereof.

However, embodiments of the invention are not restricted to those set forth herein. The above and other embodiments of the invention will become more apparent to one of ordinary skill in the art to which the invention pertains by referencing the detailed description of embodiments of the invention given below.

According to an embodiment of the invention, an organic light-emitting device comprises a first electrode, a second electrode disposed over the first electrode, a first organic light-emitting layer disposed between the first electrode and the second electrode, a second organic light-emitting layer disposed between the first organic light-emitting layer and the second electrode, a first charge generation layer (CGL) disposed between the first organic light-emitting layer and the second organic light-emitting layer, a second CGL disposed between the first CGL and the second organic light-emitting layer, and a first buffer layer disposed between the first CGL and the second CGL and including a fullerene compound which comprises at least one selected from the group consisting of C60, C70, C76, C78, and C84.

In another aspect of the present invention, an organic light-emitting device comprises a first electrode, a second electrode disposed on the first electrode, a first organic light-emitting layer disposed between the first electrode and the second electrode, a second organic light-emitting layer disposed between the first organic light-emitting layer and the second electrode, an n-type CGL disposed between the first organic light-emitting layer and the second organic light-emitting layer, and a buffer layer disposed between the n-type CGL and the second organic light-emitting layer, the buffer layer directly contacting the n-type CGL and including a fullerene compound which comprises at least one selected from the group consisting of C60, C70, C76, C78, and C84.

In still another aspect of the present invention, an organic light-emitting device comprises a first electrode, a second electrode disposed on the first electrode, a first organic light-emitting layer disposed between the first electrode and the second electrode, a second organic light-emitting layer disposed between the first organic light-emitting layer and the second electrode, a p-type CGL disposed between the first organic light-emitting layer and the second organic light-emitting layer, and a buffer layer disposed between the p-type CGL and the first organic light-emitting layer, the buffer layer directly contacting the p-type CGL and including a fullerene compound which comprises at least one selected from the group consisting of C60, C70, C76, C78, and C84.

According to the embodiments, it is possible to provide an organic light-emitting device with a tandem structure, which can lower a driving voltage while not causing any deterioration in the efficiency and lifetime properties thereof.

Other features and embodiments will be apparent from the following detailed description, the drawings, and the claims.

DETAILED DESCRIPTION OF THE EMBODIMENTS

Figure 1:
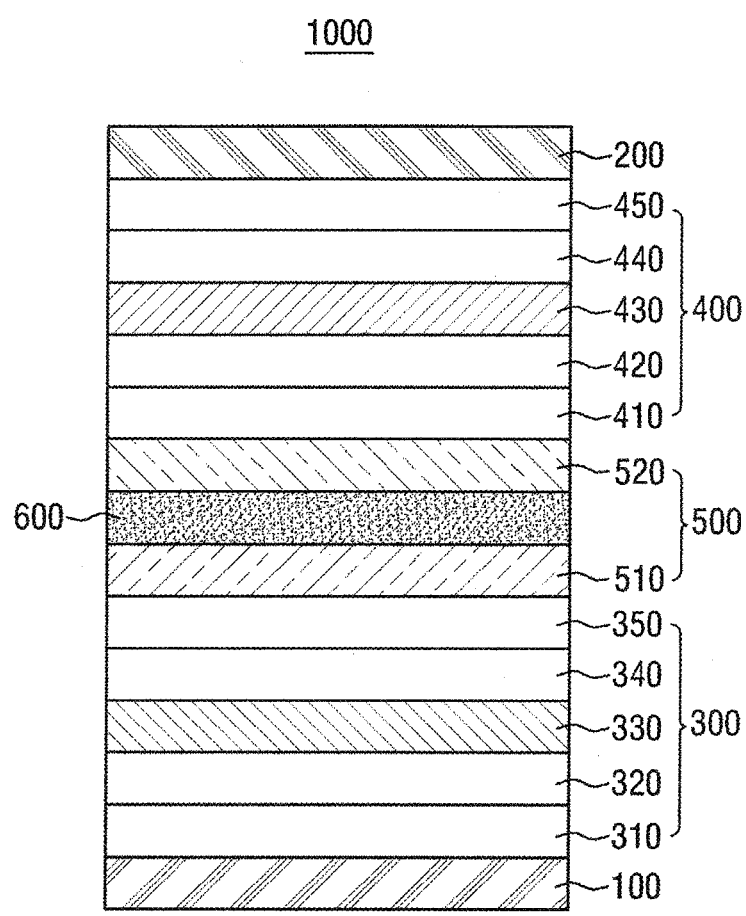
FIG. 1 is a cross-sectional view of an organic light-emitting device according to an embodiment of the invention.

The aspects and features of the present invention and methods for achieving the aspects and features will be apparent by referring to the embodiments to be described in detail with reference to the accompanying drawings. However, the present invention is not limited to the embodiments disclosed hereinafter, but can be implemented in diverse forms. The matters defined in the description, such as the detailed construction and elements, are nothing but specific details provided to assist those of ordinary skill in the art in a comprehensive understanding of the invention, and the present invention is only defined within the scope of the appended claims. In the entire description of the present invention, the same reference numerals are used for the same elements across various figures. In the drawings, sizes and relative sizes of layers and areas may be exaggerated for clarity in explanation.

The term "on" that is used to designate that an element is on another element located on a different layer or a layer includes both a case where an element is located directly on another element or a layer and a case where an element is located on another element via another layer or still another element.

Although the terms "first, second, and so forth" are used to describe diverse constituent elements, such constituent elements are not limited by the terms. The terms are used only to discriminate a constituent element from another constituent element. Accordingly, in the following description, a first constituent element may be a second constituent element.

Embodiments will hereinafter be described with reference to the accompanying drawings.

An organic light-emitting device emitting white light is generally referred to as a white organic light-emitting device. There may be two ways to implement a white organic light-emitting device. First, a single organic light-emitting layer emitting red light, green light and blue light all together may be provided to emit white light. Alternatively, a first organic light-emitting layer emitting blue light and a second organic light-emitting layer emitting red light and green light are separately provided with a charge generation layer (CGL) interposed therebetween.

The latter method may be more advantageous in the stability and operability of an organic light-emitting device. An organic light-emitting device obtained by the latter method is known to have a tandem structure.

FIG. 1 is a cross-sectional view of an organic light-emitting device 1000 according to an embodiment of the invention. Referring to FIG. 1, the organic light-emitting device 1000 may include a first electrode 100, a second electrode 200, a first light-emitting unit 300, a second light-emitting unit 400, a charge generation layer (CGL) 500 and a buffer layer 600.

The first electrode 100 may be disposed on an insulating substrate (not illustrated). The first electrode 100 may be an anode. The first electrode 100 may be formed of a conductive material with a high work function. In an organic light-emitting device 100 being of a bottom-emission type, the first electrode 100 may be formed of a material such as indium tin oxide (ITO), indium zinc oxide (IZO), ZnO or $In_2O_3$ or a deposition layer of the material. In an organic light-emitting device 1000 being of a top-emission type, the first electrode 100 may include a reflective layer, which is formed of Ag, Mg, Al, Pt, Pd, Au, Ni, Nd, Ir, Cr, Li, or Ca. Various modifications can be made to the structure of the first electrode 100 by using two or more different materials such that the first electrode 100 may have, for example, a double (or more)-layer structure. The first electrode 100 may be formed by sputtering using, for example, a fine metal mask (FMM).

The second electrode 200 may be disposed over the first electrode 100. The second electrode 200 may be a cathode. The second electrode 200 may be formed of a conductive material with a low work function. In an embodiment, the second electrode 200 may be formed of Ag, Mg, Al, Pt, Pd, Au, Ni, Nd, Ir, Cr, Li, or Ca.

The first light-emitting unit 300 may be disposed between the first electrode 100 and the second electrode 200. The first light-emitting unit 300 may directly contact the first electrode 100. The first light-emitting unit 300 may emit light of a first wavelength. The light of the first wavelength may be blue light.

The first light-emitting unit 300 may include a first hole injection layer 310, a first hole transport layer 320, a first organic light-emitting layer 330, a first electron transport layer 340 and a first electron injection layer 350.

The first hole injection layer 130 may be disposed over the first electrode 100. More specifically, the first hole injection layer 130 may directly contact the first electrode 100. The first hole injection layer 310 may receive holes from the first electrode 100. In an embodiment, the first hole injection layer 310 may be optional.

The first hole injection layer 310 may include a hole injection material. The hole injection material may be selected from one or more typical materials for injecting holes. For example, the typical materials for injecting holes may include a phthalocyanine compound, such as copper phthalocyanine, a starbust-type amine derivative, such as TCTA or m-MTDATA, and a conductive polymer, such as polyaniline/dodecylbenzenesulfonic acid (PANI/DBSA), poly(3,4-ethylenedioxythiophene)/poly(4-styrenesulfonate) (PEDOT/PSS), or polyanimine/camphor sulfonic acid (PANI/CSA) or polyaniline/poly(4-styrenesulfonate) (PANI/PSS), but the invention is not limited thereto.

The first hole transport layer 320 may be disposed on the first hole injection layer 310. More specifically, the first hole transport layer 320 may directly contact the first hole injection layer 310. The first hole transport layer 320 may receive holes from the first hole injection layer 310.

The first hole transport layer 320 may include a hole transport material. The hole transport material may be selected from one or more typical materials for transporting holes. For example, the typical materials for transporting holes may include 1,3,5-tricarbazolylbenzene, 4,4'-biscarbazolylbiphenyl, polyvinylcarbazole, m-biscarbazolylphenyl, 4,4'-biscarbazolyl-2,2'-dimethylbiphenyl, 4,4',4"-tri(N-carbazolyl)triphenylamine, 1,3,5-tri(2-carbazolylphenyl)benzene, 1,3,5-tris(2-carbazolyl-5-methoxyphenyl)benzene, bis(4-carbazolylphenyl)silane, N,N'-bis(3-methylphenyl)-N,N'-diphenyl-[1,1-biphenyl]-4,4'diamine (TPD), N,N'-di(naphthalen-1-yl)-N,N'-diphenyl benzidine (NPD), N,N'-diphenyl-N,N'-bis(1-naphthyl)-(1,1'-biphenyl)-4,4'-diamine (NPB), poly(9,9-dioctylfluorene-co-N-(4-butylphenyl)diphenylamine) (TFB), and poly(9,9-dioctylfluorene-co-bis-(4-butylphenyl-bis-N,N-phenyl-1,4-phenylene diamine (PFB), but the invention is not limited thereto.

The first organic light-emitting layer 330 may be disposed on the first hole transport layer 320. More specifically, the first organic light-emitting layer 330 may directly contact the first hole transport layer 320. The first organic light-emitting layer 330 may receive holes from the first hole transport layer 320. The first organic light-emitting layer 330 may receive electrons from the first electron transport layer 340. The holes from the first hole transport layer 320 and the electrons from the first electron transport layer 340 may be combined together and may thus generate excitons. In response to the energy level of the excitons varying due to a transition from an excited state to a ground state, light may be emitted in a color corresponding to the amount of the variation of the energy level of the excitons.

The first organic light-emitting layer 330 may emit the light of the first wavelength. In an embodiment, the light of the first wavelength may be blue light. That is, the first organic light-emitting layer 330 may be a blue organic light-emitting layer.

The first organic light-emitting layer 330 may be formed of a polymer material emitting blue light, a low molecular organic material emitting blue light, or a mixture thereof. In an embodiment, the first organic light-emitting layer 330 may include a blue host material and a blue dopant material. The blue host material may include at least one selected from an anthracene derivative and a carbazole compound, but the invention is not limited thereto. 9,10-(2-di naphthyl) anthracene (ADN) may be used as the anthracene derivative, and 4,4'-bis(carbazole-9-yl)biphenyl (CBP) may be used as the carbazole-based compound. The blue dopant material may include $F_2Irpic$, $(F_2ppy)_2Ir(tmd)$, $Ir(dfppz)_3$, and ter-fluorene, but the invention is not limited thereto.

The first electron transport layer 340 may be disposed on the first organic light-emitting layer 330. More specifically, the first electron transport layer 340 may directly contact the first organic light-emitting layer 330. The first electron transport layer 340 may receive electrons from the first electron injection layer 350. The first electron transport layer 340 may protect the first organic light-emitting layer 330 from the first electron injection layer 350. In embodiments, the first electron transport layer 340 may be a blue buffer layer (BBL).

The first electron transport layer 340 may include an electron transport material. The electron transport material may be selected from one or more typical materials for transporting electrons. For example, the typical materials for transporting electrons may include at least one of a pyrene-based material, a triazine-based material and an anthracene-based material, but the invention is not limited thereto. In an alternative example, the typical materials for transporting electrons may include quinoline derivatives, such as tris(8-quinolinorate)aluminum (Alq3), TAZ, or BAlq, but the invention is not limited thereto.

The first electron injection layer 350 may be disposed on the first electron transport layer 340. More specifically, the first electron injection layer 350 may directly contact the first electron transport layer 340. The first electron injection layer 350 may receive electrons from the CGL 500, and particularly, a first CGL 510. In an embodiment, the first electron injection layer 350 may be optional.

The first electron injection layer 350 may include an electron injection material. The electron injection material may be selected from one or more typical materials for injecting electrons. For example, the typical materials for injecting electrons may include at least one of LiF, LiQ, and NaQ, but the invention is not limited thereto. In an alternative example, the typical materials for injecting electrons may include NaCl, CsF, $Li_2O$, and BaO, but the invention is not limited thereto.

The second light-emitting unit 400 may be disposed between the first light-emitting unit 300 and the second electrode 200. The second light-emitting unit 400 may directly contact the second electrode 200. The second light-emitting unit 400 may emit light of a second wavelength, which is longer than the first wavelength. The light of the second wavelength may be yellow light. The light of the first wavelength emitted from the first light-emitting unit 300 and the light of the second wavelength emitted from the second light-emitting unit 400 may be mixed together and may thus generate white light.

The second light-emitting unit 400 may include a second hole injection layer 410, a second hole transport layer 420, a second organic light-emitting layer 430, a second electron transport layer 440 and a second electron injection layer 450.

The second hole injection layer 410 may be disposed on the CGL 500. More specifically, the second hole injection layer 410 may directly contact a second CGL 520. The second hole injection layer 410 may receive holes from the second CGL 520. In an embodiment, the second hole injection layer 410 may be optional.

The second hole injection layer 410 may include a hole injection material. The hole injection material may be selected from one or more typical materials for injecting holes. For example, the typical materials for injecting holes may include a phthalocyanine compound, such as copper phthalocyanine, a starbust-type amine derivative, such as TCTA or m-MTDATA, and a conductive polymer, such as PANI/DBSA, PEDOT/PSS, PANI/CSA or PANI/PSS, but the invention is not limited thereto. In an embodiment, the second hole injection layer 410 may be formed of the same material as the first hole injection layer 310.

The second hole transport layer 420 may be disposed on the second hole injection layer 410. More specifically, the second hole transport layer 420 may directly contact the second hole injection layer 410. The second hole transport layer 420 may receive holes from the second hole injection layer 410.

The second hole transport layer 420 may include a hole transport material. The hole transport material may be selected from one or more typical materials for transporting holes. For example, the typical materials for transporting holes may include 1,3,5-tricarbazolylbenzene, biscarbazolylbiphenyl, polyvinylcarbazole, m-biscarbazolylphenyl, 4,4'-biscarbazolyl-2,2'-dimethylbiphenyl, 4,4',4"-tri(N-carbazolyl)triphenylamine, 1,3,5-tri(2-carbazolylphenyl)benzene, 1,3,5-tris(2-carbazolyl-5-methoxyphenyl)benzene, bis(4-carbazolylphenyl)silane, TPD, NPD, NPB, TFB, and PFB, but the invention is not limited thereto. In an embodiment, the second hole transport layer 420 may be formed of the same material as the first hole transport layer 320.

The second organic light-emitting layer 430 may be disposed on the second hole transport layer 420. More specifically, the second organic light-emitting layer 430 may directly contact the second hole transport layer 420. The second organic light-emitting layer 430 may receive holes from the second hole transport layer 420. The second organic light-emitting layer 430 may receive electrons from the second electron transport layer 440. The holes from the second hole transport layer 420 and the electrons from the second electron transport layer 440 may be combined together and may thus generate excitons. In response to the energy level of the excitons varying due to a transition from an excited state to a ground state, light may be emitted in a color corresponding to the amount of the variation of the energy level of the excitons.

The second organic light-emitting layer 430 may emit light of the second wavelength, which is longer than the first wavelength. In an embodiment, the light of the second wavelength may be yellow light. That is, the second organic light-emitting layer 430 may be a yellow organic light-emitting layer. The yellow organic light-emitting layer may emit yellow light, or may emit red light and green light and then provide yellow mixed light obtained by mixing the red light and the green light.

The second light-emitting layer 430 may be formed of a polymer material emitting yellow light, a low-molecular organic material emitting yellow light, or a mixture thereof. In an embodiment, the second light-emitting layer 430 may include a yellow host material and a yellow dopant material. The yellow host material and the yellow dopant material may be Alq3 and 4-(dicyanomethylene)-2-methyl-6-(p-dimethylaminostyryl)-4H-pyran (DCM1), respectively, but the invention is not limited thereto.

Alternatively, the second light-emitting layer 430 may be formed of a material emitting red light and a material emitting green light. In an embodiment, the second light-emitting layer 430 may include a red host material, a red dopant material, a green host material and a green dopant material. The red host material may include at least one selected from a group consisting of bis(2-(2-hydroxyphenyl)benzothiazolato) zinc (Zn(BTZ)2) and bis-(2-methyl-8-quinolinolate)-4-(phenylphenolate)aluminum, but the invention is not limited thereto. The red dopant material may include PtOEP, $Ir(piq)_3$, $Btp_2Ir(acac)$, and DCJTB, but the invention is not limited thereto. The green host material may include at least one selected from an anthracene derivative and a carbazole-based compound. ADN may be used as the anthracene derivative, and CBP may be used as the carbazole-based compound. The green dopant material may include Ir(ppy)$_3$ (where ppy denotes phenylpyridine), Ir(ppy)$_2$(acac), Ir(mpyp)$_3$, and C545T, but the invention is not limited thereto. In an embodiment, the red host material may be optional.

The second electron transport layer 440 may be disposed on the second organic light-emitting layer 430. More specifically, the second organic light-emitting layer 430 may directly contact the second organic light-emitting layer 430. The second electron transport layer 440 may receive electrons from the second electron injection layer 450.

The second electron transport layer 440 may include an electron transport material. The electron transport material may be selected from one or more typical materials for transporting electrons. For example, the typical materials for transporting electrons may include at least one of a pyrene-based material, a triazine-based material and an anthracene-based material, but the invention is not limited thereto. In an alternative example, the typical materials for transporting electrons may include quinoline derivatives, such as Alq3, TAZ, or BAlq, but the invention is not limited thereto. The second electron transport layer 440 may be formed of the same material as the first electron transport layer 340.

The second electron injection layer 450 may be disposed on the second electron transport layer 440. More specifically, the second electron injection layer 450 may directly contact the second electron transport layer 440. The second electron injection layer 450 may receive electrons from the second electrode 200. In an embodiment, the second electron injection layer 450 may be optional.

The second electron injection layer 450 may include an electron injection material. The electron injection material may be selected from one or more typical materials for injecting electrons. For example, the typical materials for injecting electrons may include at least one of LiF, LiQ, and NaQ, but the invention is not limited thereto. In an alternative example, the typical materials for injecting electrons may include NaCl, CsF, Li$_2$O, and BaO, but the invention is not limited thereto. The second electron injection layer 450 may be formed of the same material as the first electron injection layer 350.

The CGL 500 may be disposed between the first light-emitting unit 300 and the second light-emitting unit 400. In the illustrated embodiment, the CGL 500 may directly contact the first electron injection layer 350 of the first light-emitting unit 300 and the first hole injection layer 310 of the second light-emitting unit 400. The CGL 500 may generate charges, and may transmit the charges to the first light-emitting unit 300 and the second light-emitting unit 400.

The CGL 500 may include the first CGL 510 and the second CGL 520.

The first CGL 510 may directly contact the first light-emitting unit 300. The first CGL 510 may provide electrons to the first electron injection layer 350 of the first light-emitting unit 300. The first CGL 510 may be an n-type CGL. In an embodiment, the first CGL 510 may include a typical electron transport material doped with an alkali metal or an alkali earth metal. In another embodiment, the first CGL 510 may include a typical electron transport material doped with an n-type organic material. The alkali metal, the alkali earth metal and the n-type organic material will hereinafter be referred to as n-type dopants.

The second CGL 520 may directly contact the second light-emitting unit 400. The second CGL 520 may provide holes to the second hole injection layer 410 of the second light-emitting unit 400. The second CGL 520 may be a p-type CGL. In an embodiment, the second CGL 520 may include a single organic material such as hexaaza-triphenylene-hexanitrile (HATCN). In another embodiment, the second CGL 520 may include a single inorganic material such as WO$_3$. In still another embodiment, the second CGL 520 may include a typical hole transport material doped with a p-type organic material.

The buffer layer 600 may be disposed between the first CGL 510 and the second CGL 520. The buffer layer 600 may directly contact both the first CGL 510 and the second CGL 520. The buffer layer 600 may include fullerene. In an embodiment, the buffer layer 600 may include at least one of C60, C70, C76, C78, and C84. In another embodiment, the buffer layer 600 may include at least one of C60 derivative, C70 derivative, C76 derivative, C78 derivative, and C84 derivative.

C60 derivative, C70 derivative, C76 derivative, C78 derivative, and C84 derivative may include functional groups, such as hydrogen, halogen group, nitro group, cyano group, carboxylic acid group, hydroxy group and etc, but the invention is not limited thereto.

The formation of the first electrode 100, the second electrode 200, the first light-emitting unit 300, the second light-emitting unit 400, the CGL 500 and the buffer layer 600 may be followed by a heat treatment process for improving the stability of the organic light-emitting device 1000. In an embodiment, the heat treatment process may be performed for about one hour at a temperature of about 100° C. after the formation of the first electrode 100, the second electrode 200, the first light-emitting unit 300, the second light-emitting unit 400, the CGL 500 and the buffer layer 600. During the heat treatment process, an n-type dopant, which has a low molecular weight, may diffuse from the first CGL 510 into the layers above or below the first CGL 510 and may thus lower the efficiency and the lifetime properties of the organic light-emitting device 1000. The organic light-emitting device 1000 would not even be able to properly perform its functions, especially if the n-type dopant diffuses into the second CGL 520.

However, according to the embodiment of FIG. 1, the buffer layer 600 is provided between the first CGL 510 and the second CGL 520. Accordingly, the n-type dopant of the first CGL 510 can be prevented or inhibited from diffusing into the second CGL 520. Thus, diffusion of n-type dopants of the first CGL 510 into the second CGL 520 can be minimized or reduced. Since the buffer layer 600, which includes fullerene, can prevent or inhibit the n-type dopant of the first CGL 510 from diffusing into the second CGL 520 during a heat treatment process, the efficiency and the lifetime properties of the organic light-emitting device 1000 is reduced or minimized. The buffer layer 600 can also lower a driving voltage for driving the organic light-emitting device 1000.

Figure 2:
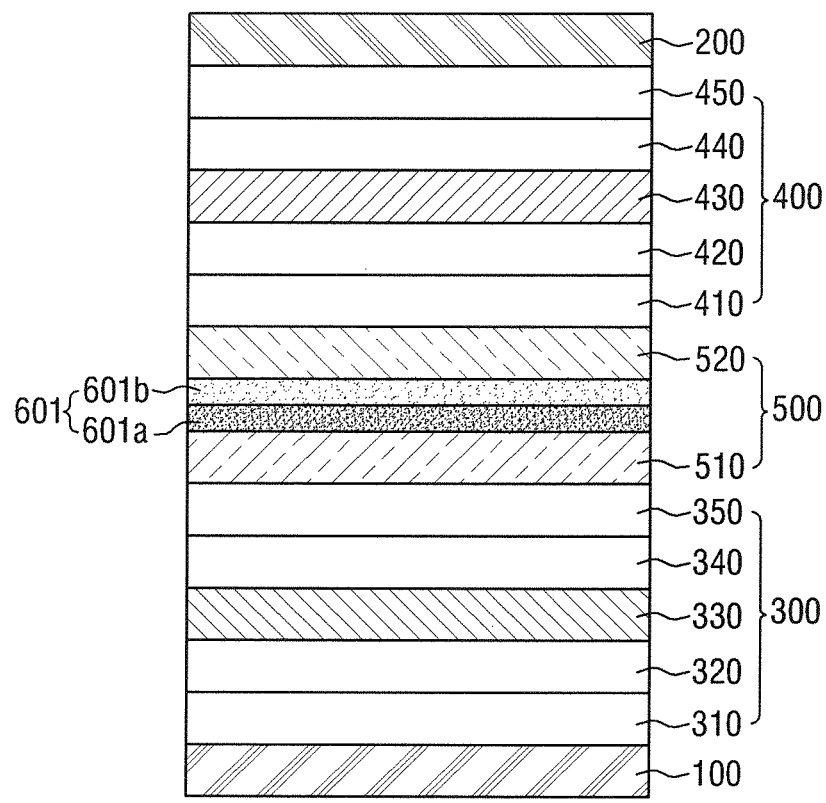
FIG. 2 is a cross-sectional view of an organic light-emitting device according to another embodiment of the invention.

FIG. 2 is a cross-sectional view of an organic light-emitting device 1001 according to another embodiment of the invention. In FIGS. 1 and 2, like reference numerals indicate like elements, and thus, detailed descriptions thereof will be omitted.

Referring to FIG. 2, a buffer layer 601 may include a first sub-layer 601a and a second sub-layer 601b. The first sub-layer 601a may directly contact a first CGL 510, and the second sub-layer 601b may directly contact a second CGL 520. The concentration of fullerene in the first sub-layer 601a may be higher than the concentration of fullerene in the second sub-layer 601b.

According to the embodiment of FIG. 2, since the first sub-layer 601a, which has a high concentration of fullerene, is placed adjacent to the first CGL 510, an n-type dopant of the first CGL 510 can be further prevented or inhibited from diffusing from the first CGL 510 into the second CGL 520 during a heat treatment process.

Figure 3:
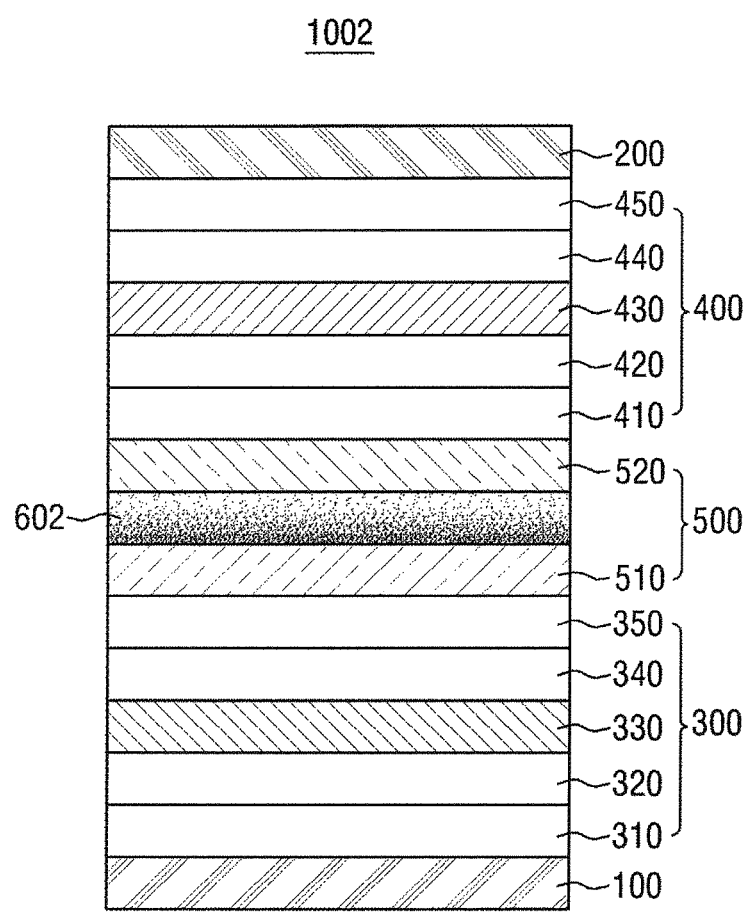
FIG. 3 is a cross-sectional view of an organic light-emitting device according to another embodiment of the invention.

FIG. 3 is a cross-sectional view of an organic light-emitting device 1002 according to another embodiment of the invention. In FIGS. 1 and 3, like reference numerals indicate like elements, and thus, detailed descriptions thereof will be omitted.

Referring to FIG. 3, the concentration of fullerene in a buffer layer 602 may vary with a predetermined slope. In an embodiment, the concentration of fullerene in the buffer layer 602 may gradually increase in a direction from a second CGL 520 to a first CGL 510.

According to the embodiment of FIG. 3, since part of the buffer layer 602 having a relatively high concentration of fullerene is placed adjacent to the first CGL 510, an n-type dopant of the first CGL 510 can be further prevented or inhibited from diffusing from the first CGL 510 into the second CGL 520 during a heat treatment process.

Figure 4:
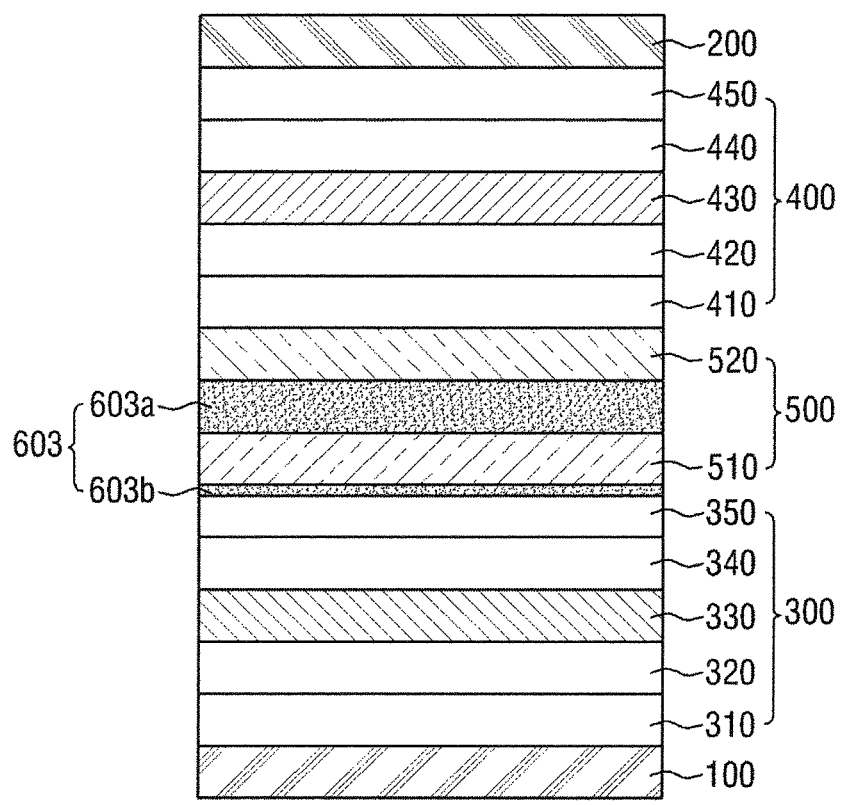
FIG. 4 is a cross-sectional view of an organic light-emitting device according to another embodiment of the invention.

FIG. 4 is a cross-sectional view of an organic light-emitting device 1003 according to another embodiment of the invention. In FIGS. 1 and 4, like reference numerals indicate like elements, and thus, detailed descriptions thereof will be omitted.

Referring to FIG. 4, a buffer layer 603 may include a first buffer layer 603a and a second buffer layer 603b. The first buffer layer 603a may be substantially the same as the buffer layer 600 of FIG. 1. The second buffer layer 603b may be disposed between a first CGL 510 and a first light-emitting unit 300. More specifically, the second buffer layer 603b may directly contact the first CGL 510 and a first electron injection layer 350. The second buffer layer 603b may be formed of substantially the same material as the first buffer layer 603a. In embodiments, the second buffer layer 603b, like the first buffer layer 603a, may include fullerene. The second buffer layer 603b may be thinner than the first buffer layer 603a. In an embodiment, the second buffer layer 603b may have a thickness of about 10 Å to about 20 Å.

According to the embodiment illustrated in FIG. 4, since the organic light-emitting device 1003 includes a fullerene-based buffer layer 603 not only at the top, but also at the bottom of the first CGL 510, an n-type dopant of the first CGL 510 can be prevented or inhibited from diffusing into the layers above or below the first CGL 510. In order not to interfere with the transmission of electrons from the first CGL 510 to the first electron injection layer 350, the second buffer layer 603b, which is disposed below the first CGL 510, may be formed to be thin. In response to the second buffer layer 603b being formed to a thickness of about 10 Å to about 20 Å, the diffusion of the n-type dopant of the first CGL 510 can be prevented or inhibited without deteriorating the electron-transmitting properties of the first CGL 510.

The organic light-emitting device 1000 of FIG. 1 and a related-art organic light-emitting device will hereinafter be compared with each other. More specifically, the organic light-emitting device 1000 and a related-art organic light-emitting device to be compared with the organic light-emitting device 1000 will hereinafter be respectively described in the "Example Embodiment" section and the "Comparative Example" section below.

Example Embodiment

The first electrode 100 was formed of ITO on an insulating substrate. The first hole injection layer 310 and the first hole transport layer 320 were formed of TCTA and 1,3,5-tricarbazolylbenzene, respectively, on the first electrode 100. The first organic light-emitting layer 330 was formed of ADN and $F_2Irpic$ on the first hole transport layer 320. The first electron transport layer 340 and the first electron injection layer 350 were formed of Alq3 and LiQ, respectively, on the first organic light-emitting layer 330. The first CGL 510 was formed on the first electron injection layer 350 by using Alq3 doped with an alkali metal. The buffer layer 600 was formed of fullerene (particularly, C60) on the first CGL 510. The second CGL 520 was formed of HATCN on the buffer layer 600. The second hole injection layer 410 and the second hole transport layer 420 were formed on the second CGL 520 by using the same materials as the first hole injection layer 310 and the first hole transport layer 320, respectively. The second light-emitting layer 430 was formed of ADN, $Ir(piq)_3$, and $Ir(ppy)_3$ on the second hole transport layer 420. The second electron transport layer 440 and the second electron injection layer 450 were formed on the second light-emitting layer 430 by using the same materials as the first electron transport layer 340 and the first electron injection layer 350, respectively. The second electrode 200 was formed of Ag on the second electron injection layer 450.

Comparative Example

Another organic light-emitting device was fabricated in the same manner as the organic light-emitting device 1000 except that no buffer layer 600 was provided.

The organic light-emitting device 1000 and the other organic light-emitting device were subjected to a heat treatment process for one hour at a temperature of 100° C., and were then driven. Table 1 below shows measurements obtained by driving the organic light-emitting device 1000 and the other organic light-emitting device at the same luminance of 3000 nit, and Table 2 below shows measurements obtained by driving the organic light-emitting device 1000 and the other organic light-emitting device with the same current density of 5 J. In Tables 1 and 2, Op.V denotes a driving voltage, J denotes a current density, L denotes luminance, cd/A denotes device efficiency, 1 m/W denotes power efficiency, EQE denotes external quantum efficiency, and x and y denote color coordinates.

TABLE 1

|  | Op. V | J | L | cd/A | lm/W | EQE | x | y |
|---|---|---|---|---|---|---|---|---|
| Comparative Example | 7.20 | 5.8 | 3000 | 51.3 | 22.4 | 25.3 | 0.324 | 0.319 |
| Example Embodiment | 6.44 | 5.9 | 3000 | 50.8 | 24.8 | 24.0 | 0.305 | 0.323 |

TABLE 2

|  | Op. V | J | L | cd/A | lm/W | EQE | x | y |
|---|---|---|---|---|---|---|---|---|
| Comparative Example | 7.06 | 5 | 2560 | 51.2 | 22.8 | 25.3 | 0.325 | 0.319 |
| Example Embodiment | 6.32 | 5 | 2543 | 50.9 | 25.3 | 24.0 | 0.307 | 0.325 |

As shown in Tables 1 and 2 above, the organic light-emitting device 1000, unlike the other organic light-emitting device, can efficiently lower a driving voltage while not causing any deterioration in efficiency.

While the invention has been particularly shown and described with reference to embodiments thereof, it will be understood by those of ordinary skill in the art that various changes may be made therein without departing from the spirit and scope of the invention as defined by the following claims. The embodiments should be considered in a descriptive sense only and not for purposes of limitation.

What is claimed is:

1. An organic light-emitting device, comprising:
a first electrode;
a second electrode disposed over the first electrode;
a first organic light-emitting layer disposed between the first electrode and the second electrode;
a second organic light-emitting layer disposed between the first organic light-emitting layer and the second electrode;
a first charge generation layer (CGL) disposed between the first organic light-emitting layer and the second organic light-emitting layer;
a second CGL disposed between the first CGL and the second organic light-emitting layer;
a first buffer layer disposed between the first CGL and the second CGL, the first buffer layer comprising a fullerene compound; and
a second buffer layer disposed between the first CGL and the first organic light-emitting layer, wherein the second buffer layer is formed of substantially the same material as the first buffer layer,
wherein the second buffer layer is separately disposed from the first buffer layer by the first CGL disposed between the first buffer layer and the second buffer layer;
wherein the second buffer layer is thinner than the first buffer layer.

2. The organic light-emitting device of claim 1, wherein the first CGL is an n-type CGL and the second CGL is a p-type CGL, wherein the first buffer layer is configured to inhibit n-type dopant in the n-type CGL from diffusing into the second CGL.

3. The organic light-emitting device of claim 1, wherein the fullerene compound comprises at least one selected from the group consisting of C60, C70, C76, C78, and C84.

4. The organic light-emitting device of claim 1, wherein the first organic light-emitting layer is further configured to emit light of a first wavelength and the second organic light-emitting layer is further configured to emit light of a second wavelength, which is longer than the first wavelength.

5. The organic light-emitting device of claim 4, wherein the light of the first wavelength and the light of the second wavelength are configured to produce white light when mixed together.

6. The organic light-emitting device of claim 1, wherein the first organic light-emitting layer is configured to emit blue light and the second organic light-emitting layer is configured to emit yellow light.

7. The organic light-emitting device of claim 1, wherein the first electrode is an anode and the second electrode is a cathode.

8. The organic light-emitting device of claim 1, wherein the first buffer layer includes a first sub-layer, which is disposed adjacent to the first CGL, and a second sub-layer, which is disposed adjacent to the second CGL and the first sub-layer has a higher concentration of the fullerene compound than the second sub-layer.

9. The organic light-emitting device of claim 1, wherein the first buffer layer is further configured to have a concentration of the fullerene compound that gradually increases in a direction from the second CGL to the first CGL.

10. The organic light-emitting device of claim 1, wherein the second buffer layer directly contacts the first CGL.

11. An organic light-emitting device, comprising:
a first electrode;
a second electrode disposed over the first electrode;
a first organic light-emitting layer disposed between the first electrode and the second electrode;
a second organic light-emitting layer disposed between the first organic light-emitting layer and the second electrode;
an n-type charge generation layer (CGL) disposed between the first organic light-emitting layer and the second organic light-emitting layer;
a buffer layer disposed between the n-type CGL and the second organic light-emitting layer, the buffer layer directly contacting the n-type CGL and comprising a fullerene compound; and
a second buffer layer disposed between the n-type CGL and the first organic light-emitting layer, wherein the second buffer layer is formed of substantially the same material as the buffer layer, wherein the second buffer layer is separately disposed from the buffer layer by the n-type CGL disposed between the buffer layer and the second buffer layer;
wherein the second buffer layer is thinner than the first buffer layer.

12. The organic light-emitting device of claim 11, further comprising a p-type CGL disposed between the buffer layer and the second organic light-emitting layer, the p-type CGL directly contacting the buffer layer.

13. The organic light-emitting device of claim 11, wherein the fullerene compound comprises at least one selected from the group consisting of C60, C70, C76, C78, and C84.

14. The organic light-emitting device of claim 11, wherein the first organic light-emitting layer is configured to emit light of a first wavelength, the second organic light-emitting layer is further configured to emit light of a second wavelength, which is longer than the first wavelength, and the light of the first wavelength and the light of the second wavelength are configured to produce white light when mixed together.

15. An organic light-emitting device, comprising:
a first electrode;
a second electrode disposed over the first electrode;
a first organic light-emitting layer disposed between the first electrode and the second electrode;
a second organic light-emitting layer disposed between the first organic light-emitting layer and the second electrode;
a p-type charge generation layer (CGL) disposed between the first organic light-emitting layer and the second organic light-emitting layer;
a buffer layer disposed between the p-type CGL and the first organic light-emitting layer, the buffer layer directly contacting the p-type CGL and comprising a fullerene compound; and
a second buffer layer disposed between the p-type CGL and the first organic light-emitting layer, wherein the second buffer layer is formed of substantially the same material as the buffer layer, wherein the second buffer layer is separately disposed from the buffer layer by the p-type CGL disposed between the buffer layer and the second buffer layer;
wherein the second buffer layer is thinner than the first buffer layer.

16. The organic light-emitting device of claim 15, further comprising an n-type CGL disposed between the buffer layer and the first organic light-emitting layer, the n-type CGL directly contacting the buffer layer.

17. The organic light-emitting device of claim 15, wherein the fullerene compound comprises at least one of C60, C70, C76, C78, and C84.

18. The organic light-emitting device of claim 15, wherein the first organic light-emitting layer is configured to emit light of a first wavelength, the second organic light-emitting layer is further configured to emit light of a second wavelength, which is longer than the first wavelength, and the light of the first wavelength and the light of the second wavelength configured to produce white light when mixed together.

* * * * *